(12) United States Patent
NIshimura

(10) Patent No.: US 9,831,854 B2
(45) Date of Patent: Nov. 28, 2017

(54) CURRENT REGULATION CIRCUIT

(71) Applicant: DENSO CORPORATION, Kariya, Aichi-pref. (JP)

(72) Inventor: Yasuhiro NIshimura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/345,688

(22) Filed: Nov. 8, 2016

(65) Prior Publication Data

US 2017/0222635 A1    Aug. 3, 2017

(30) Foreign Application Priority Data

Jan. 28, 2016 (JP) ................. 2016-014387

(51) Int. Cl.
*H03K 3/00* (2006.01)
*H03K 5/01* (2006.01)
*H02P 31/00* (2006.01)

(52) U.S. Cl.
CPC ............... *H03K 5/01* (2013.01); *H02P 31/00* (2013.01)

(58) Field of Classification Search
CPC .................................. H03K 5/01; H02P 31/00
USPC .......................................................... 327/109
See application file for complete search history.

(56) References Cited

U.S. PATENT DOCUMENTS

| | | | |
|---|---|---|---|
| 7,768,436 B2 * | 8/2010 | Johnson | B60R 16/027 180/271 |
| 9,621,379 B2 * | 4/2017 | Pauli | H04L 25/0264 |
| 2007/0188187 A1 * | 8/2007 | Oliva | H04L 25/0278 326/30 |
| 2010/0308838 A1 * | 12/2010 | Lee | G08C 19/00 324/537 |
| 2012/0007573 A1 * | 1/2012 | Oh | G11C 5/143 323/284 |
| 2012/0146404 A1 * | 6/2012 | Fuchida | B60R 16/02 307/9.1 |
| 2014/0301502 A1 * | 10/2014 | Hoshika | H03K 5/12 375/295 |
| 2015/0244274 A1 * | 8/2015 | Fahlenkamp | H02M 3/33507 363/21.15 |
| 2015/0295738 A1 * | 10/2015 | Mori | H04B 3/54 375/238 |
| 2016/0182258 A1 * | 6/2016 | Pauli | H04L 25/0264 375/257 |
| 2016/0204831 A1 * | 7/2016 | Isoda | H04L 5/1415 375/257 |

FOREIGN PATENT DOCUMENTS

JP    2011-53102 A    3/2011

* cited by examiner

*Primary Examiner* — Ryan Jager

(74) *Attorney, Agent, or Firm* — Posz Law Group, PLC

(57) ABSTRACT

A current is supplied from a power source voltage supply node of a power source voltage to an open-collector of a transistor through a current blocking circuit, connectors and a signal transmission line. A microcomputer regulates a resistance value of a pull-up resistor by switching over an on/off state of a switch circuit in accordance with the power source voltage detected by a power source voltage detection circuit. The microcomputer thus regulates a current blocking rate of the current blocking circuit.

8 Claims, 5 Drawing Sheets

CURRENT REGULATION CIRCUIT

CROSS REFERENCE TO RELATED APPLICATION

This application is based on Japanese patent application No. 2016-14387 filed on Jan. 28, 2016, the whole contents of which are incorporated herein by reference.

FIELD

The present disclosure relates to a current regulation circuit for regulating a pulse current.

BACKGROUND

JP 2011-053102A proposes a control system for controlling a brushless motor, for example. This conventional control system includes a control circuit, which outputs a rotation command signal to a driving circuit for driving a brushless motor. The control circuit generates a pulse signal having a frequency corresponding to a set rotation speed of the motor and outputs it to the driving circuit. The driving circuit drives the motor in response to the pulse signal inputted from the control circuit.

In the conventional control system described above, the pulse signal is outputted from an open-collector or an open-drain (collectively referred to as open-collector below), for example, when a rotation detection pulse is generated. The rotation detection pulse is generated in response to a signal change in a signal transmission line connected to the open-collector by turning on and off a transistor.

In this operation, it is repeated that a current flows in the signal transmission line when the transistor is turned on and the current does not flow in the signal transmission line when the transistor is turned off. For this reason, a current change arises in the signal transmission line and radiates an unnecessary electromagnetic wave as radio noise. It is thus required to reduce radiation of the unnecessary electromagnetic wave in compliance with recent regulation on unnecessary electromagnetic radiation.

At a contact of a connector, a contaminant film such as an oxide film is formed as use environment changes for the worse and use period increases. It is required to supply a current in excess of a sufficient amplitude for preventing the contaminant film from being formed and breaking the contaminant film already formed, so that quality of the contact of the connector may be maintained.

It is thus desired to lower the current amplitude level of a pulse current for reducing radiation of the unnecessary electromagnetic wave, It is also desired to increase the current amplitude level for maintaining the quality of the contact of the connector without significant deterioration.

SUMMARY

It is therefore an object to provide a current regulation circuit, which reduces unnecessary radiation of an electromagnetic wave and maintains quality of a contact of a connector without significant deterioration.

A current regulation circuit is provided for a pulse detection circuit, which detects a pulse signal generated in a transmission line when a transistor is turned on and off in response to a pulse control signal applied to a control terminal of the transistor under a state that a power source voltage is supplied to an open collector or drain of the transistor through a connector and the signal transmission line. The current regulation circuit comprises a current blocking circuit and a regulation part. The current blocking circuit blocks a current supplied to the open collector or drain of the transistor from the power source voltage through the connector and the signal transmission line. The regulation part regulates a current amplitude level of the pulse signal developed in the signal transmission line in a predetermined range by regulating a current blocking rate of the current blocking circuit in accordance with a value corresponding to the power source voltage outputted from a power source voltage acquisition part.

DETAILED DESCRIPTION OF THE EMBODIMENT

Figure 1:
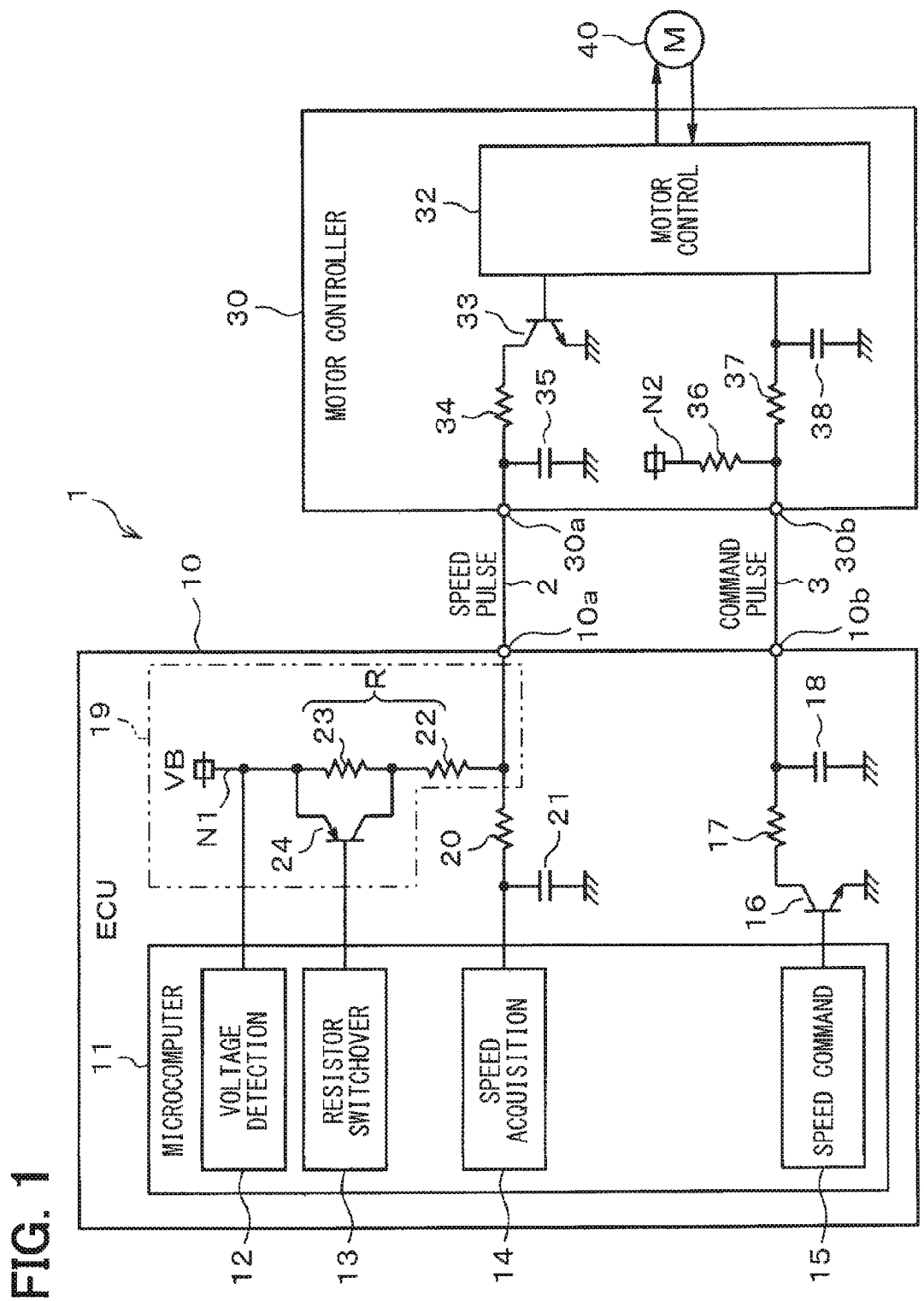
FIG. 1 is a block diagram showing schematically an entire electric configuration of a first embodiment of a current regulation circuit.

A current regulation circuit will be described below with reference to plural embodiments shown in the drawings. A rotation speed detection device shown in the following embodiments is provided for a vehicle and detects a rotation speed of an air-conditioning or cooling fan mounted in a vehicle for example. Same or similar reference numerals are used to designate structural parts, which perform same or similar operations, in the following embodiments for simplicity.

(First Embodiment)

Referring to FIG. 1 showing an entire configuration of a cooling control system 1, a pulse current regulation circuit is provided. The cooling control system 1 is mounted in a vehicle and configured to cool a battery, which is an electric power source of a hybrid vehicle, for example.

As shown in FIG. 1, the cooling control system 1 includes an electronic control unit (ECU) 10 and a motor controller 30, which are provided as separate units and located at different positions. The ECU 10 and the motor controller 30 are connected via signal transmission lines 2 and 3. The signal transmission line 2 connects a connector 10a of the ECU 10 and a connector 30a of the motor controller 30. The signal transmission line 3 connects a connector 10b of the ECU 10 and a connector 30b of the motor controller 30. Each of the signal transmission lines 2 and 3 is formed of a wire harness (E/H) of a predetermined length of about 1 to 2 meters, for example.

The ECU 10 includes a microcomputer 11 formed of a CPU, a RAM, a ROM, and EEPROM, an A/D converter and the like, which are not shown, and controls the motor controller 30 based on programs stored in the microcomputer 11. The microcomputer 11 has functions as a power source voltage detection circuit 12, a pull-up resistor switchover circuit 13, a rotation speed acquisition circuit 14 and a rotation speed command circuit 15.

The ECU 10 receives sensor output signals of various sensors, which are not shown. The microcomputer 11 of the ECU 10 generates a command signal pulse for rotating the fan at a predetermined rotation speed by the function of rotation speed command circuit 15 based on those sensor output signals and outputs the command signal pulse to the motor controller 30 through the connectors 10b, 30b and the signal transmission line 3. The command signal pulse is a pulse signal, a duty ratio of which is variably determined.

A transistor 16, a resistor 17 and a capacitor 18 are provided between the rotation speed command circuit 14 and the connector 10b. The transistor 16 is formed of, for example, a PNP bipolar transistor, with its base, emitter and collector being connected to the rotation speed command circuit 14, grounded and open (that is, connected to the resistor 17), respectively. A chassis of the vehicle provides a ground. A low-pass filter formed of the resistor 17 and the capacitor 18 is provided between the collector of the transistor 16 and the connector 10b.

The motor controller 30 is a circuit for cooling a battery (not shown) by driving a fan, which is not shown, by the motor 40. The motor controller 30 includes, for example, a motor control part 32, a transistor 33, resistors 34, 36, 37 and capacitors 35, 38. The resistor 36, which is a pull-up resistor, and a low-pass filter formed of the resistor 37 and the capacitor 38 are provided between the connector 30b and the motor control part 32. The resistor 36 is connected between a power source voltage supply node N2 and the connector 30b. Following the pull-up resistor 36, the resistor 37 and the capacitor 38 forming the low-pass filter is provided. When the motor 40 rotates at a frequency lower than about 1 kHz, respective values of the resistor 37 and the capacitor 38 are determined to pass such a frequency.

The motor control part 32 drives the motor 40 in response to the command signal pulse inputted from the ECU 10 through the signal transmission line 3. The motor 40 is mounted in the vehicle and rotates at a frequency lower than 1 kHz. The motor control part 32 outputs a rotation speed pulse signal to the ECU 10 through the signal transmission line 2 in proportion to an actual rotation speed of the motor 40. The transistor 33, the resistor 34 and the capacitor 35 are provided between the motor control part 32 and the connector 30a.

The transistor 33 is formed of, for example, an NPN bipolar transistor with its base, emitter and collector being connected to the motor control part 32, grounded and open (that is, connected to the resistor 34), respectively. A signal of a rotation sensor, which is not shown, provided in the motor control part 32 is applied to a base of the transistor 33 as a pulse control signal. The rotation sensor may be formed of a resolver having a sensing part, which opposedly faces protrusions formed on a rotation shaft of the motor 40. Each protrusion is formed at every predetermined rotation angular interval. Since the protrusions rotates as the rotation shaft of the motor 40 rotates, the sensing part, which is fixed in position, is capable of detecting a position of the protrusion. The transistor 33 turns on and off in correspondence to the rotation of the motor 40.

The low-pass filter formed of the resistor 34 and the capacitor 35 is connected to the collector of the transistor 33. The pulse signal corresponding to the rotation pulse is generated on the signal transmission line 2. In a case that the motor 40 rotates at a frequency lower than about 1 kHz, respective values of the resistor 34 and the capacitor 35 forming the low-pass filter are also determined to pass such a frequency.

The ECU 10 receives the pulse signal as the rotation speed pulse from the motor controller 30 through the connectors 30a and 10a and is used as a pulse detection circuit for detecting the pulse signal. The microcomputer 11 acquires the actual rotation speed of the motor based on the pulse signal by the function of the rotation speed acquisition circuit 14. A current blocking circuit 19 and a low-pass filter formed of a resistor 20 and a capacitor 21 are provided between the connector 10a and the rotation speed acquisition circuit 14. An input impedance of the rotation speed acquisition circuit 14 is set to be larger than an output impedance of the filter formed of the resistor 20 and the capacitor 21.

A power source voltage VB is supplied to a power source voltage supply node N1. The power source voltage VB is provided for operating the ECU 10 and corresponds to a voltage +B of a power source provided from a battery, which is mounted in the vehicle and different from the battery for cooling. The current blocking circuit 19 includes a pull-up resistor R formed of resistors 22, 23 and a switch circuit 24 for switching over shorting (ON) and opening (OFF) both ends of the resistor 23. The current blocking circuit 19 operates as a current supply part. The current blocking circuit 19 regulates a current blocking rate (rate of blocking a current), which varies with the power source voltage VB supplied from the power source voltage supply node N1 by regulating a value of the pull-up resistor R between the power source voltage supply node N1 and the connector 10a.

The switch circuit 24 is formed of, for example, a PNP transistor. A base of the transistor 24 of the switch circuit 24 is connected to the pull-up resistor switchover circuit 13. An emitter and a collector of the transistor 24 is connected to both ends of the resistor 23. The switch circuit 24 is not limited to a circuit configuration of a signal PNP transistor but may be a circuit configuration of a combination of a resistor and a switch of various transistors, as far as the resistance value of the pull-up resistor R is switchable to different resistance values. The resistance value of the resistor 22 is set to be far larger than that of the resistor 34. The resistance value of the resistor 23 is also set to be far larger than that of the resistor 34.

The pull-up resistor switchover circuit 13 is configured to switch over the switchover circuit 24 between an on-state (ON) and an off-state (OFF). When the pull-up resistor switchover circuit 13 switches over the switchover circuit 24 to the on-state, the resistor 23 is short-circuited and the resistance value of the pull-up resistor R between the power source voltage supply node N1 and the connector 10a is decreased to a predetermined small resistance value. When the pull-up resistor switchover circuit 13 switches over the switchover circuit 24 to the off-state, the resistor 23 is not short-circuited and the resistance value of the pull-up resistor R between the power source voltage supply node Ni and the connector 10a is increased to a predetermined large resistance value. The microcomputer 11 detects and acquires the power source voltage VB supplied to the power source voltage supply node N1 by the power source voltage detection circuit 12. The microcomputer 11 further controls the switch circuit 24 to either the on-state or the off-state by the pull-up resistor switchover circuit 13 in accordance with the acquired value of the power source voltage VB. The pull-up resistor switchover circuit 13 of the microcomputer 11 is thus configured as a regulating part for regulating the current blocking rate of the current blocking circuit 19.

The resistance values of the pull-up resistor R and the resistor 34 are preset so that a current, which flows in the signal transmission line 2 when the transistor 33 is turned on, exceeds a predetermined value thereby to maintain quality of the contacts of the connectors 10a and 30a.

The microcomputer 11 of the ECU 10 calculates an optimum rotation speed of the motor 40 by using the rotation speed of the motor 40 acquired by the rotation speed acquisition circuit 14 and uses this calculation result for generating the command signal pulse to be transmitted to the motor controller 30 through the signal transmission line 3. Particularly, the rotation speed acquisition circuit 14 of the microcomputer 11 includes a comparator, a counter and a rotation speed calculation part, which are not shown, and outputs the acquired actual rotation speed of the motor 40 to the rotation speed command circuit 15. Thus the acquired rotation speed is fed back to generation processing of the rotation command signal.

Figure 2:
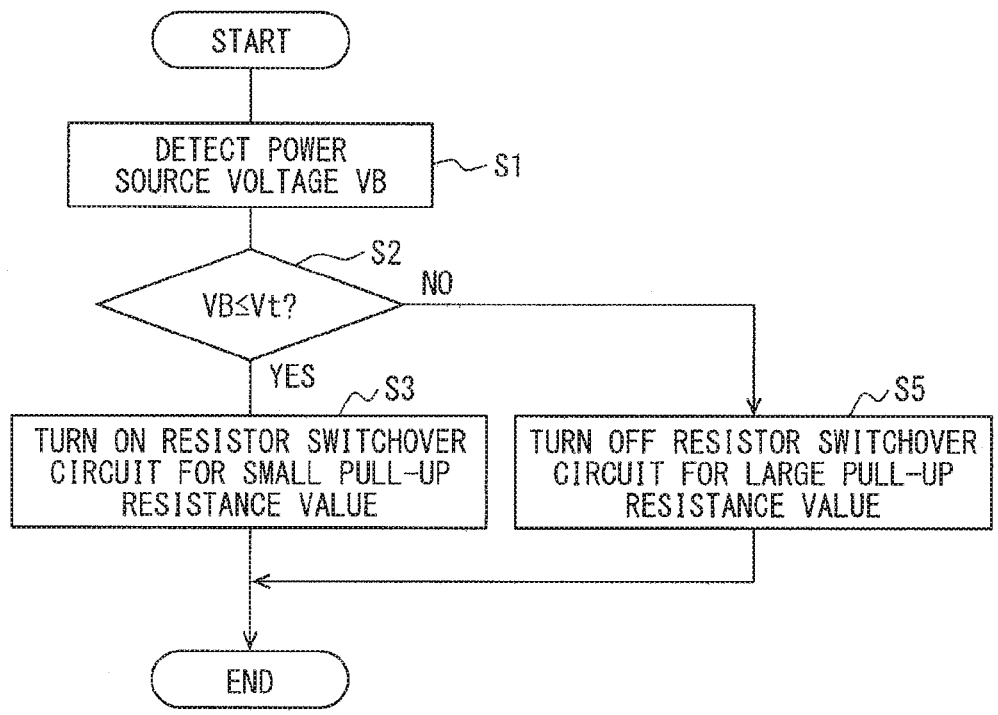
FIG. 2 is a flowchart showing schematically an operation of a microcomputer in the first embodiment.

An operation of the first embodiment will be described next. A switch-over operation of the pull-up resistor R will be described generally first with reference to a flowchart shown in FIG. 2. As shown in FIG. 2, the microcomputer 11 acquires at step S1 the power source voltage VB detected by the power source voltage detection circuit 12 and checks at step 52 whether the acquired power source voltage VB is equal to or lower than the predetermined value Vt by comparing it with the predetermined value Vt.

When the power source voltage VB is equal to or lower than the predetermined value Vt (YES at step S2), the microcomputer 11 turns on the switch circuit 24 by the pull-up resistor switchover circuit 13 at step S3. As a result, the value of the pull-up resistor R is decreased to a small resistance value, which is generally equal to the resistance value of only the resistor 22. When the microcomputer 11 determines at step S2 that the power source voltage VB is higher than the predetermined value Vt (NO at step S2), the microcomputer 11 turns off the switchover circuit 24 by the pull-up resistor switchover circuit 13 at step S5. As a result, the resistance value of the pull-up resistor R is increased to a large resistance value, which corresponds to a resistance value of a series connection of the resistors 22 and 23.

That is, in the first embodiment, when the power source voltage VB is in different ranges (for example, equal to or lower than Vt, higher than Vt), which are defined by a predetermined threshold voltage (that is, predetermined value Vt=10V) of the power source voltage VB, the values of the pull-up resistor R are made to be different between the different ranges, so that the current amplitudes at the connectors 10a and 30a are maintained at the same value between the different ranges of the power source voltage VB. Thus, the resistance value of the pull-up resistor R is switched over in two stages.

Figure 3:
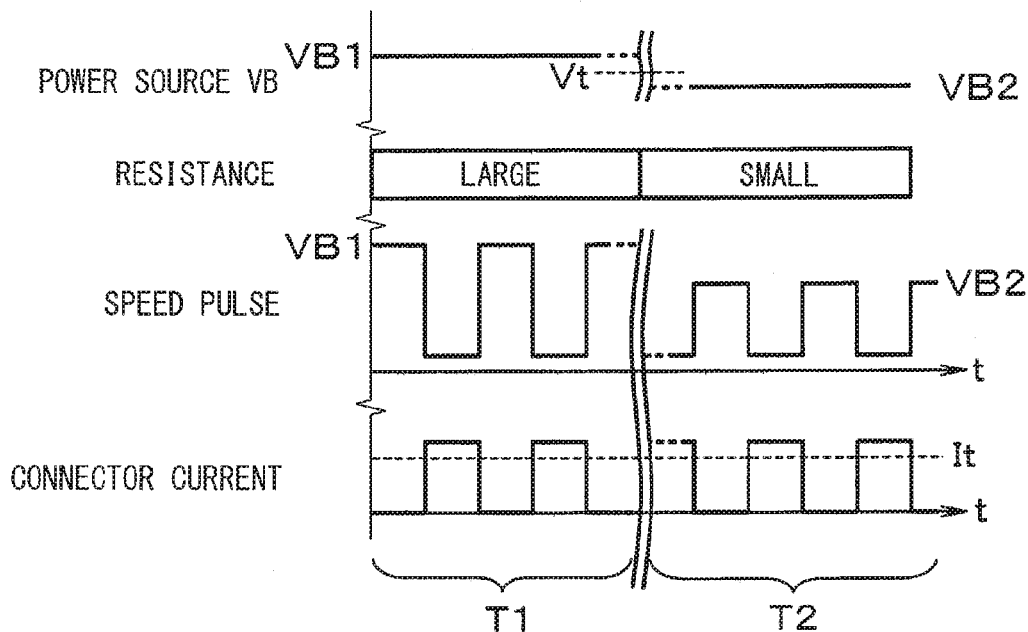
FIG. 3 is a timing chart showing schematically a resistance value change in a pull-up resistor and a signal change at each node in the first embodiment.

FIG. 3 generally shows, as a timing chart, a signal change in the signal transmission line 2, which is caused by rotation of the motor 40, with respect to time. FIG. 3 shows, from top to bottom, the power source voltage VB, resistance value, rotation speed pulse voltage and connector current, which flows through the connectors 10a and 30a. The abscissa axis in FIG. 3 indicates time. In the following description the predetermined value Vt, which is a threshold level of the power source voltage VB, is assumed to be 10V, for example.

The ECU 10 receives various sensor output signals from its outside and generates the command signal pulse for rotating the motor 40 based on the received sensor output signals. The command signal pulse is outputted to the motor control part 32 of the motor controller 30 through the signal transmission line 3. The motor control part 32 rotates the motor 40 in correspondence to the command signal pulse. The fan is thus rotated and the battery, which is the power source for the hybrid vehicle, is cooled.

When the motor 40 is rotated, the transistor 33 repeats turning on and off in correspondence to the rotation of the motor 40. When the transistor 33 turns on, the power source voltage VB is divided by the pull-up resistor R and the resistor 34. The voltage developed by the resistor 34 is applied to the connectors 10a and 30a and inputted to the rotation speed acquisition circuit 14. The value of the current flowing through the connectors 10a and 30a equals a value of division of the power source voltage VB by the pull-up resistor R and the resistor 34. When the transistor 33 turns off, the current does not flow in the resistor R and hence the voltage, which is close to the power source voltage VB is inputted to the rotation speed acquisition circuit 14.

As a result, the voltage applied to the connectors 10a and 30a is the pulse voltage, which corresponds to the rotation of the motor 40. A voltage amplitude level of the pulse voltage varies in proportion to the power source voltage VB. The rotation speed acquisition circuit 14 inputs the received pulse voltage to the comparator as a rotation speed signal to convert it into a digital signal and counts the digital signal by a counter provided in the rotation speed acquisition circuit 14. The rotation speed acquisition circuit 14 thus acquires the actual rotation speed of the motor 40 based on a count value of the counter. The actual rotation speed acquired as described above is fed back as a parameter to be used by the ECU 10 in generating the command signal pulse.

As shown in a period T1 of FIG. 3, when the power source voltage VB is VB1=12V (>Vt), which is equal to a standard value of the battery voltage +B, for example, the microcomputer 11 compares the power source voltage VB1 with the predetermined value Vt upon detection of the power source voltage VB by the power source voltage detection circuit 12. The microcomputer 11 determines NO at step S2 of FIG. 2 and the pull-up resistor switchover circuit 13 controls the switch circuit 24 to turn off at step S5. The resistance value of the pull-up resistor R is thus increased to the large resistance value. For this reason, the voltage amplitude level of the pulse voltage applied to the connectors 10a and 30a is the power source voltage VB1, which is relatively high.

When the transistor 33 is turned on and off in this state, the current flows through the resistors 23, 22 and 34 in response to the turn-on of the transistor 33 and the current flows to the capacitors 21 and 35 in response to the turn-off of the transistor 33. After the capacitors 21 and 35 are charged, the current does not flow and the voltage is increased.

The current amplitude level of the pulse current, which flows in the connectors 10a and 30a when the transistor 33 is turned on, equals a division of the power source voltage VB1 by the series resistance value of the series connection of the resistors 23, 22 and 34. When the transistor 33 is tuned on, the electric charges stored in the capacitors 21 and 35 are discharged. The electric charge stored in the capacitor 21 is discharged to the ground through the resistors 20 and 34. The electric charge stored in the capacitor 35 is discharged to the ground through the resistor 34.

As shown in a period T2 of FIG. 3, when the power source voltage VB is VB2=8V (<Vt<VB1) and the battery voltage +B is relatively low, for example, the microcomputer 11 compares the power source voltage VB2 with the predetermined value Vt upon detection of the power source voltage VB by the power source voltage detection circuit 12. The microcomputer 11 determines YES at step S2 of FIG. 2 and the pull-up resistor switchover circuit 13 controls the switch circuit 24 to turn on at step S3. The resistance value of the pull-up resistor R is thus increased. For this reason, the voltage amplitude level of the pulse voltage applied to the connectors 10a and 30a is the power source voltage VB2, which is relatively low.

When the transistor 33 is turned on and off in this state, the current flows through the switch circuit 24 and the resistors 22, 34 in response to the turn-on of the transistor 33 and the current flows to the capacitors 21 and 35 in response to the turn-off of the transistor 33, After the capacitors 21 and 35 are charged, the current does not flow and the capacitor charge voltage is increased.

The current amplitude level of the pulse current, which flows in the connectors 10a and 30a when the transistor 33 is turned on, equals a division of the power source voltage VB2 by the series resistance value of the series connection of the resistors 22 and 34. When the transistor 33 is tuned on, the electric charges of the capacitors 21 and 35 of the filters are discharged. The electric charge of the capacitor 21 is discharged to the ground through the resistors 20 and 34. The electric charge of the capacitor 35 is discharged to the ground through the resistor 34.

That is, when the microcomputer 11 detects that the power source voltage VB is relatively low, it regulates the current amplitude level of the pulse current flowing in the connectors 10a and 30a to be in a predetermined range, which is around a level higher than a predetermined value It, by decreasing the resistance value of the pull-up resistor R. When the microcomputer 11 detects that the power source voltage VB is relatively high, it regulates the current amplitude level of the pulse current flowing in the connectors 10a and 30a to be in a predetermined range, which is around a level higher than a predetermined value It, by increasing the resistance value of the pull-up resistor R Thus the microcomputer 11 regulates the current amplitude level of the pulse current, which flows in the connectors 10a, 30a and the signal transmission line 2, to be in the predetermined range by appropriately regulating the relation between the power source voltage VB and the series resistance value of the resistors 23, 22 and 34.

Assuming that the resistance values of the resistors 22 and 23 are several kilo ohms (kΩ) and the resistance value of the resistor 34 is 100 ohms (Ω), the current amplitude level of the pulse current flowing to the connectors 10a and 30a when the switchover circuit 24 is turned on is regulated to be in the predetermined range, for example, about several milliamperes (mA).

As described above, in the first embodiment, the microcomputer 11 regulates the current blocking rate of the current blocking circuit 19 in accordance with the power source voltage VB and regulates the current amplitude level of the pulse signal generated in the connectors 10a, 30a and the signal transmission line 2 to be in the predetermined range. As a result, it is possible to suppress unnecessary radiation of electromagnetic wave and maintain the quality of the contacts of the connectors 10a and 30a without large deterioration.

The microcomputer 11 regulates the current blocking rate of the current blocking circuit 19 by switching over the switchover circuit 24 to decrease the resistance value of the pull-up resistor R for increasing the current, when the power source voltage VB detected by the power source voltage detection circuit 12 is decreased. The microcomputer 11 also regulates the current blocking rate of the current blocking circuit 19 by switching over the switchover circuit 24 to increase the resistance value of the pull-up resistor R for decreasing the current, when the power source voltage VB detected by the power source voltage detection circuit 12 is increased. It is thus possible to regulate the rate of blocking of the current in correspondence to a change in the power source voltage VB.

The microcomputer 11 regulates in stages the current blocking rate of the circuit 10 so that the current amplitude levels at the connectors 10a and 30a are the same between the different ranges, which are preset based on the predetermined value Vt of the power source voltage VB detected by the power source voltage detection circuit 12.

(Second Embodiment)

Figure 4:
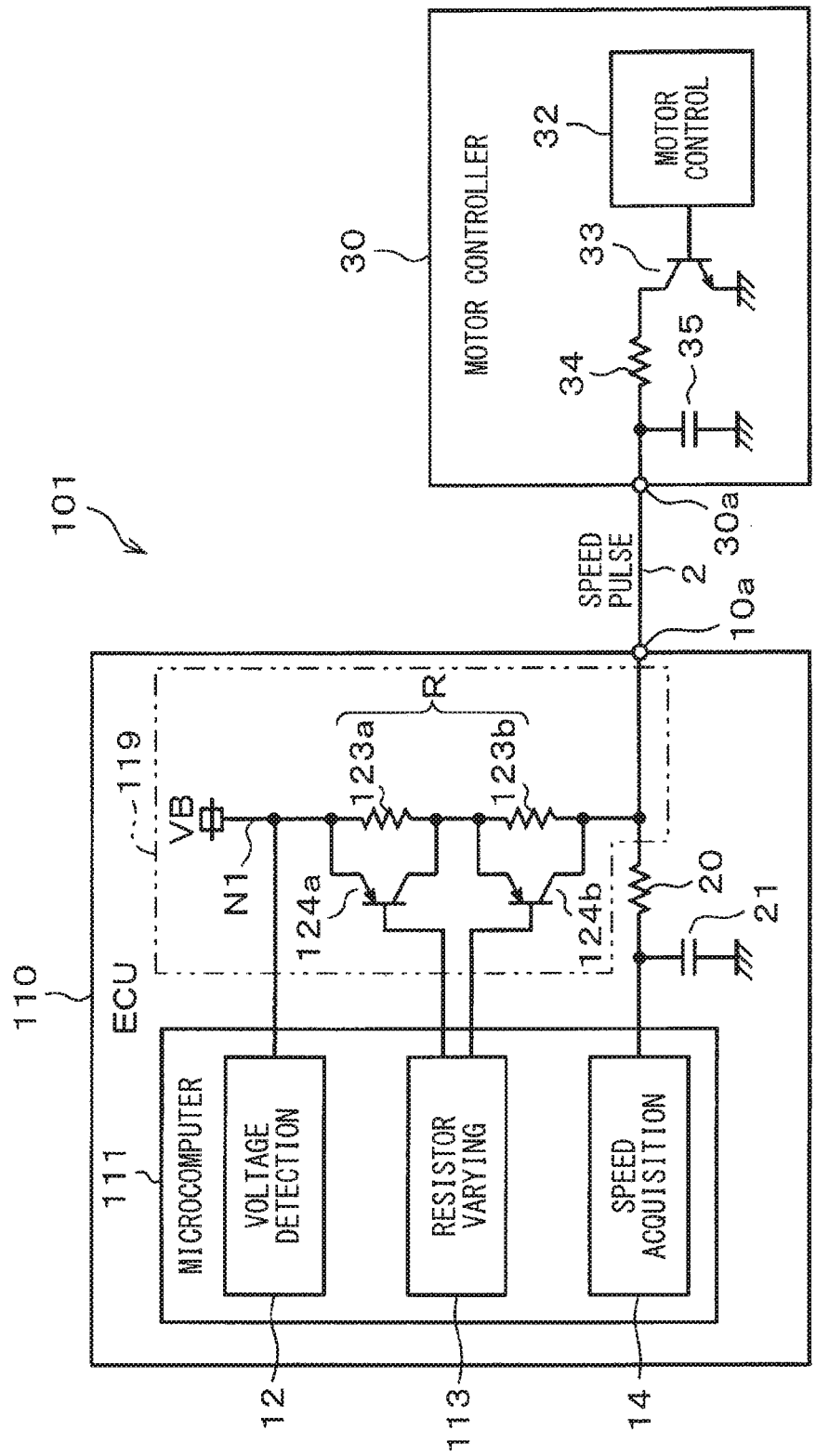
FIG. 4 is a block diagram showing schematically a part of electric configuration of a second embodiment of a current regulation circuit.

FIG. 4 is an electric wiring diagram showing a part of FIG. 1, particularly an additional part provided in a second embodiment. Other parts, which are not shown in FIG. 4, are the same as the first embodiment shown in FIG. 1 and will not be described. In FIG. 4, the parts designated with the same reference numerals as in FIG. 1 have the same functions and hence such parts will not be described in the second embodiment.

In a cooling control system 101, pull-up resistors 123a and 123b are connected in series between the power source voltage supply node N1 and the connector 10a. An ECU 110, which is provided in place of the ECU 10, includes a microcomputer 111 in place of the microcomputer 11. The microcomputer 111 includes a pull-up resistor varying circuit 113 in place of the pull-up resistor switchover circuit 13.

The pull-up resistor varying circuit 113 switches over an on-state and an off-state of switch circuits 124a and 124b, which are provided in place of the switchover circuit 24, in accordance with the power source voltage VB detected by the power source voltage detection circuit 12. Each of the switch circuits 124a and 124b is formed of, for example, a PNP bipolar transistor. The switch circuit 124a is configured to switchably short and open both ends of the resistor 123a. The switch circuit 124b is configured to switchably short and open both ends of the resistor 123b. The pull-up resistor R is formed of a series circuit of the resistors 123a and 123b.

A current blocking circuit 119 is formed of the switch circuits 124a, 124b and the resistors 123a, 123b and operates as a current supply part. The microcomputer 111 opens and shorts both ends of the resistors 123a and 123b by the pull-up resistor varying circuit 113 and the switch circuits 124a, 124b. The microcomputer 111 thus regulates the resistance value of the pull-up resistor R in two or three stages. As described in the first embodiment, a resistor, which corresponds to the resistor 22 not switchable to short and open by the switch circuits 124a and 124b, may be connected between the power source voltage supply node N1 and the connector 10a or between the common connection node of the resistor 123b and the resistor 20.

In the second embodiment, it is possible to provide different resistance values of the pull-up resistor R among plural ranges of the power source voltage VB (for example, lower than 9V, equal to or higher than 9V and equal to or lower than 11V, and higher than 11V), which are preset by plural predetermined threshold values (for example, 9V and 11V) of the voltage VB. In this example, the resistance value of the pull-up resistor R is switchable in three stages. The resistance value of the pull-up resistor R is regulated to be different one another among three ranges of the power source voltage VB to regulate the current at the contacts of the connectors 10a and 30a to equal values among the plural ranges. The resistance value of the resistor R may be switched over in four or more stages.

According to the second embodiment, the microcomputer 111 regulates in steps the current blocking rate of the current blocking circuit 119 to be different one another among plural ranges, which are preset by plural threshold values, so that the current at the connectors 10a and 30a are the same among the plural voltage ranges of the power source voltage. The microcomputer 111 regulates the current blocking rate of the current blocking circuit 119 in plural stages by shorting and opening plural resistors 123a and 123b by the switch circuits 123a and 123b. Thus the current blocking rate is regulated in plural stages. Since the resistance value of the resistor R is increased when a high voltage is applied as the power source voltage VB, radio noise is reduced to be as low as possible.

(Third Embodiment)

Figure 5:
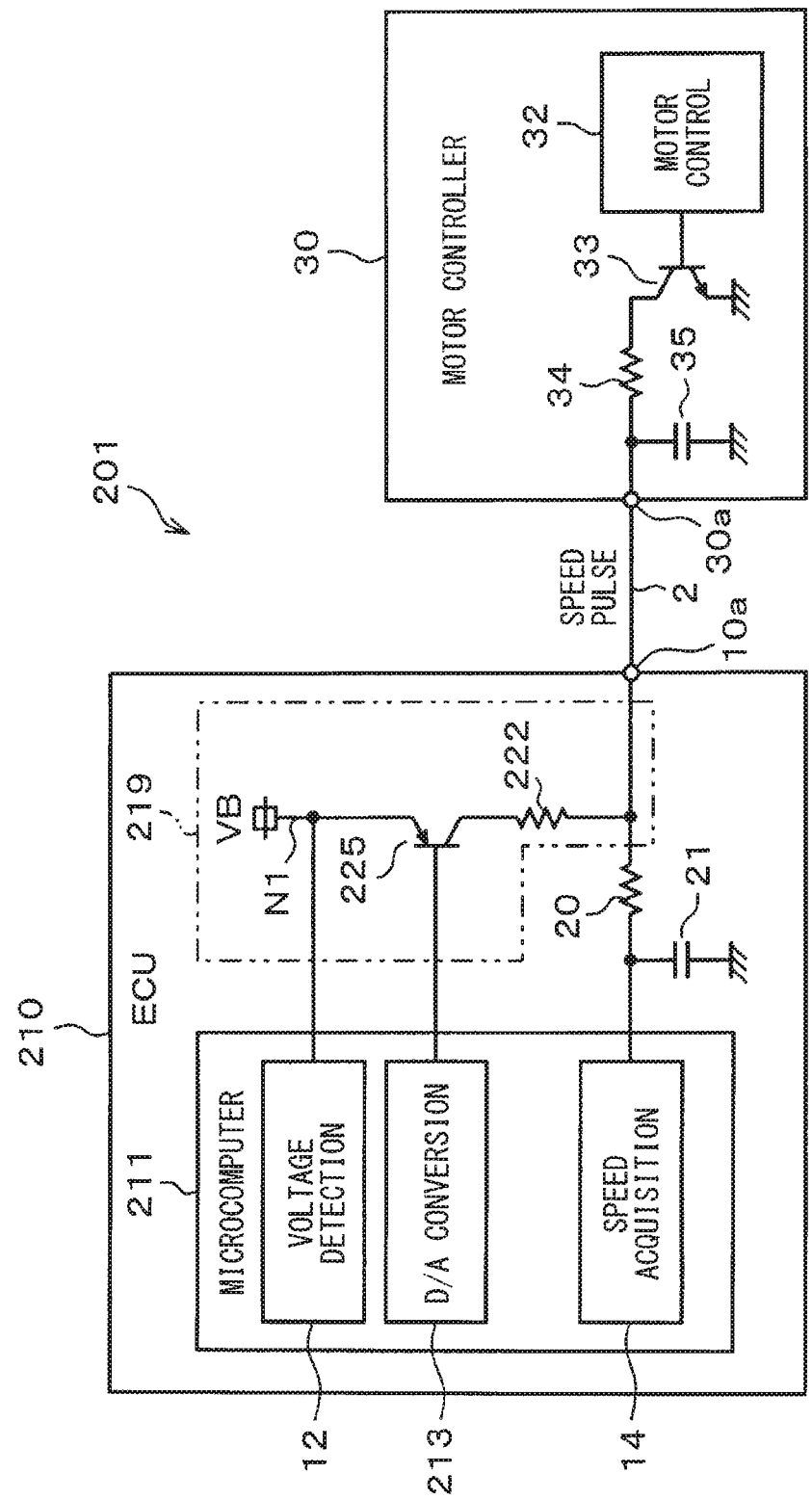
FIG. 5 is a block diagram showing schematically a part of electric configuration of a third embodiment of a current regulation circuit.

FIG. 5 is an electric wiring diagram showing a part of FIG. 1 and shows an additional part in a third embodiment. Other parts, which are not shown, are the same as the first embodiment shown in FIG. 1 and will not be described. In FIG. 5, the parts designated with the same reference numerals as in FIG. 1 have the same functions and will not be described in the third embodiment.

In a cooling control system 201, an emitter-collector path of a PNP transistor 225 and a resistor 222 are connected in series between the power source voltage supply node N1 and the connector 10a. An ECU 210, which is provided in place of the ECU 10, includes a microcomputer 211 in place of the microcomputer 11. The microcomputer 211 includes a D/A conversion circuit 213 in place of the pull-up resistor switchover circuit 13.

The power source voltage detection circuit 12 detects the voltage VB as a digital value by performing analog-to-digital conversion processing by an A/D converter, which is not shown. The D/A conversion circuit 213 outputs an analog voltage, which varies with the digital value of the power source voltage VB detected by the power source voltage detection circuit 12. The microcomputer 211 outputs the analog voltage by the D/A conversion circuit 213 such that it increases as the power source voltage VB increases. The microcomputer 211 outputs the analog voltage by the D/A conversion circuit 213 such that it decreases as the power source voltage VB decreases.

Since the collector current and the emitter current of the PNP transistor 225 vary with the signal applied to the base of the PNP transistor 225, an emitter-collector voltage, the emitter current and the collector current of the transistor 225 are regulated by the microcomputer 211, which regulates the amplitude of the output analog voltage of the D/A conversion circuit 213 and applies the regulated voltage to the base of the PNP transistor 225.

Since the microcomputer 211 outputs the analog voltage by the D/A conversion circuit 213 so that the analog voltage increases as the voltage VB increases, the emitter-base voltage of the transistor 225 is maintained in a predetermined range and the base current of the transistor 225 is maintained in a predetermined range. As a result, the collector current of the transistor 225, which flows when the transistor 33 is turned on, is regulated to be within a predetermined range. The D/A conversion circuit 213 outputs the analog voltage so that the analog voltage decreases as the voltage VB decreases, the emitter-base voltage of the transistor 225 is maintained in a predetermined range and the base current of the transistor 225 is maintained in a predetermined range. As a result, the collector current of the transistor 225, which flows when the transistor 33 is turned on, is regulated to be within a predetermined range.

For this reason, the collector current of the transistor 225 is regulated to be within the predetermined range even when the voltage VB increases and decreases. As a result, even when the transistor 33 is turned on and off by rotation of the motor 40, the current amplitude level of the pulse current, which flows through the connectors 10a and 30a is regulated to be within a predetermined range.

According to the third embodiment, the microcomputer 211 varies the analog voltage of the circuit 214 in accordance with the power source voltage VB and applies it to the base of the transistor 225 thereby to regulate the collector current of the transistor 225 flowing in the on-state of the transistor 33 to be within the predetermined range. As a result, even when the transistor 33 is turned on and off, the current amplitude level of the pulse current, which flows through the connectors 10a and 30a is regulated to be within the predetermined range.

(Fourth Embodiment)

Figure 6:
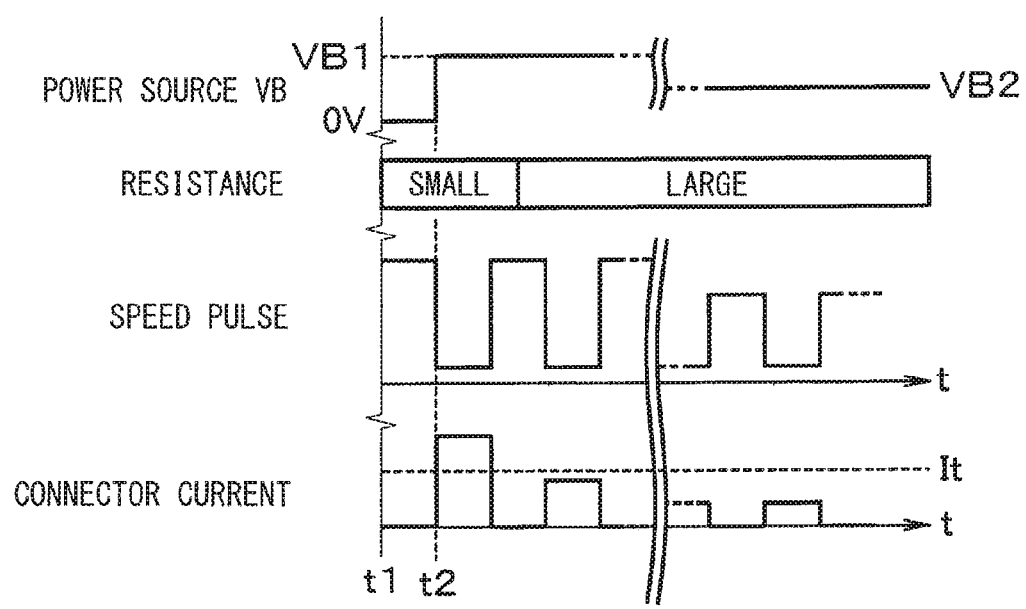
FIG. 6 is a timing chart showing schematically a resistance value change in a pull-up resistor and a signal change at each node in a fourth embodiment of a current regulation circuit.

FIG. 6 shows an additional part in a fourth embodiment. The basic configuration of the fourth embodiment is the same as the first embodiment and will not be described.

In the first embodiment described above, the current supplied to the signal transmission line 2 is set to be equal to or higher than the predetermined value It for preventing quality deterioration of the contacts of the connectors 10a and 30a. As far as the quality of the contacts of the connectors 10a and 30a is prevented from deterioration, the current need not always be increased to reach the predetermined value It.

The current may be controlled as follows, for example. Before timing t1, which is prior to power-on shown in FIG. 6, the current blocking rate of the current blocking circuit 19 is regulated to the small resistance value. When the voltage VB rises to VB1 at timing t2 after the power-on, the current amplitude level of the pulse current of one pulse is increased to attain the predetermined value It. Then the resistance value of the resistor R is controlled to increase so that the current amplitude level of the second and subsequent pulses is decreased to be lower than the predetermined value It. The number of pulses, the current amplitude level of which attains the predetermined value It, is not limited to one, which is immediately after the power-on, but may be any number of pulses.

As described above, in the fourth embodiment, the current blocking rate of the current blocking circuit 19 is regulated to be low by decreasing the resistance of the resistor R after the power-on to the rise of the voltage VB to the predetermined threshold value and then the current blocking rate of the current blocking circuit 19 is increased to be higher than the predetermined value by increasing the resistance value of the resistor R. As a result, it is possible to protect the contacts of the connectors 10a and 30a from oxidation and suppress the current regularly supplied to the connectors 10a and 30a.

(Other Embodiment)

The current regulation circuit is not limited to the embodiments described above but may be implemented with various modifications as exemplified below.

The plural embodiments described above may be combined. For example, although the fourth embodiment is configured based on the first embodiment as a basic configuration, it may be configured based on the second or third embodiment as a basic configuration. Although the power source voltage value acquisition part is configured as the power source voltage detection circuit 12, which directly detects the voltage VB, it may be configured to acquire a value, which is a division of the voltage VB by a resistor division circuit, for example. Any other configuration may be used as far as it is possible to acquire a value, which corresponds to the voltage VB.

In the embodiments described above, the base of the bipolar transistor is used as a control terminal and the collector and the emitter of the same are used as current supply terminals. However, type of the transistor is not limited. For example, in place of the bipolar transistors of the PNP or NPN type used in the embodiments, MOSFETs of P-channel or N-channel type may be used. In this case, a gate is used as the control terminal and a source and a drain are used as the current supply terminals. The open-collector configuration in the embodiments may be changed to an open-drain configuration.

What is claimed is:

1. A current regulation circuit for a pulse detection circuit, which detects a pulse signal generated in a transmission line when a transistor is turned on and off in response to a pulse control signal applied to a control terminal of the transistor under a state that a power source voltage is supplied to an open collector or drain of the transistor through a connector and the signal transmission line, the current regulation circuit comprising:
a current blocking circuit for blocking a current supplied to the open collector or drain of the transistor from the power source voltage through the connector and the signal transmission line;
a regulation part for regulating a current amplitude level of the pulse signal developed in the signal transmission line in a predetermined range by regulating a current blocking rate of the current blocking circuit in accordance with a value corresponding to the power source voltage outputted from a power source voltage acquisition part; and
the regulation part regulates the current blocking rate of the current blocking circuit to be lower than a predetermined rate until the power source voltage acquired by the power source voltage acquisition part at power-on time is confirmed to be higher than a predetermined threshold value, and then increases the current blocking rate to be higher than the predetermined rate.

2. The current regulation circuit according to claim 1, wherein the current blocking circuit includes:
a pull-up resistor; and
a switch circuit, which switches over shorting and opening of the pull-up resistor.

3. The current regulation circuit according to claim 2, wherein:
the regulation part regulates the current blocking rate of the current blocking circuit by switching over the switch circuit to decrease a resistance value of the pull-up resistor, when the power source voltage acquired by the power source voltage acquisition part is determined to decrease.

4. The current regulation circuit according to claim 2, wherein:
the regulation part regulates the current blocking rate of the current blocking circuit by switching over the switch circuit to increase a resistance value of the pull-up resistor, when the power source voltage acquired by the power source voltage acquisition part is determined to increase.

5. The current regulation circuit according to claim 2, wherein:
the pull-up resistor includes plural resistors connected in series; and
the regulating part regulates the current blocking rate of the current blocking circuit by shorting and opening each of the plural pull-up resistors by the switch circuit.

6. The current regulation circuit according to claim 1, wherein:
the regulation part regulates the current blocking rate of the current blocking circuit in a stage corresponding to a range of the power source voltage acquired by the power source voltage acquisition part, the range being preset by predetermined threshold values and the current blocking rate in the range being maintained at a same value.

7. The current regulation circuit according to claim 6, wherein:
the regulation part regulates the current blocking rate of the current blocking circuit in plural stages corresponding to plural ranges preset by predetermined threshold values, the current blocking rate being different among the plural ranges to maintain the current amplitude level of the pulse signal developed in the signal transmission line to be same among the plural ranges.

8. The current regulation circuit according to claim 1, wherein:
the current blocking circuit includes a transistor, which varies a current flowing in a current supply terminal in accordance with a signal applied to a control terminal; and
the regulation part regulates the current blocking rate of the current blocking circuit by varying the signal applied to the control terminal of the transistor in accordance with the detection value of the power source voltage acquired by the power source voltage acquisition part.

* * * * *